United States Patent
Huang

(10) Patent No.: US 9,175,819 B2
(45) Date of Patent: Nov. 3, 2015

(54) LIGHT-EMITTING DEVICE WITH GRAPHENE ENHANCED THERMAL PROPERTIES AND SECONDARY WAVELENGTH CONVERTING LIGHT SHADE

(71) Applicant: Genesis Photonics Inc., Tainan (TW)

(72) Inventor: Kuan-Chieh Huang, Tainan (TW)

(73) Assignee: Genesis Photonics Inc., Tainan (TW)

( * ) Notice: Subject to any disclaimer, the term of this patent is extended or adjusted under 35 U.S.C. 154(b) by 0 days.

(21) Appl. No.: 14/282,264

(22) Filed: May 20, 2014

(65) Prior Publication Data

US 2014/0355238 A1 Dec. 4, 2014

(30) Foreign Application Priority Data

May 29, 2013 (TW) .............................. 102118970 A

(51) Int. Cl.
| | |
|---|---|
| *H01L 33/50* | (2010.01) |
| *H01L 33/64* | (2010.01) |
| *F21V 29/87* | (2015.01) |
| *F21K 99/00* | (2010.01) |
| *F21V 29/90* | (2015.01) |

(52) U.S. Cl.
CPC . *F21K 9/56* (2013.01); *F21V 29/87* (2015.01); *F21V 29/90* (2015.01); *H01L 33/644* (2013.01)

(58) Field of Classification Search
CPC .............. H01L 29/1606; H01L 33/64–33/644; C01B 31/04; F21V 29/20; F21V 29/004; F21V 29/503; F21V 29/507–29/508; F21V 29/87; F21V 29/90; F21K 9/00; F21Y 2101/02
See application file for complete search history.

(56) References Cited

U.S. PATENT DOCUMENTS

| | | | |
|---|---|---|---|
| 8,519,603 B2 | 8/2013 | Yang et al. | |
| 8,803,412 B2* | 8/2014 | Sanders et al. | 313/485 |
| 2010/0102697 A1* | 4/2010 | Van De Ven et al. | 313/46 |
| 2011/0147775 A1* | 6/2011 | Hikosaka et al. | 257/98 |
| 2011/0315956 A1* | 12/2011 | Tischler et al. | 257/13 |
| 2012/0074430 A1* | 3/2012 | Lee et al. | 257/79 |
| 2012/0087127 A1* | 4/2012 | Veerasamy et al. | 362/249.02 |
| 2012/0134158 A1* | 5/2012 | Yang et al. | 362/294 |
| 2012/0181501 A1* | 7/2012 | Sung | 257/9 |
| 2013/0120999 A1* | 5/2013 | Yao et al. | 362/293 |
| 2013/0121002 A1* | 5/2013 | Lin et al. | 362/296.04 |
| 2013/0153943 A1* | 6/2013 | Lee | 257/91 |
| 2013/0277697 A1* | 10/2013 | Lai et al. | 257/98 |
| 2014/0084318 A1* | 3/2014 | Kim | 257/98 |
| 2014/0127488 A1* | 5/2014 | Zhamu et al. | 428/216 |
| 2014/0131757 A1* | 5/2014 | Lin et al. | 257/99 |
| 2014/0185269 A1* | 7/2014 | Li | 362/84 |
| 2014/0272385 A1* | 9/2014 | Dickinson et al. | 428/323 |
| 2014/0307427 A1* | 10/2014 | Joo et al. | 362/186 |
| 2014/0307442 A1* | 10/2014 | Ting | 362/293 |

(Continued)

*Primary Examiner* — Laura Menz
*Assistant Examiner* — Maliheh Malek
(74) *Attorney, Agent, or Firm* — Jianq Chyun IP Office

(57) ABSTRACT

A light-emitting device includes a light-emitting component. The light-emitting component includes a circuit board, a light-emitting diode which is mounted on and electrically connected to the circuit board, a wavelength-converting shell which covers the light-emitting diode, and a heat conductive layer which is formed on the wavelength-converting shell and which includes graphene.

11 Claims, 1 Drawing Sheet

(56) References Cited

U.S. PATENT DOCUMENTS

| | | | |
|---|---|---|---|
| 2014/0319562 A1* | 10/2014 | Li et al. | 257/98 |
| 2014/0332828 A1* | 11/2014 | Hasenoehrl et al. | 257/88 |
| 2014/0346543 A1* | 11/2014 | Chen et al. | 257/98 |
| 2014/0355241 A1* | 12/2014 | Takenaka et al. | 362/84 |
| 2015/0001465 A1* | 1/2015 | Tischler et al. | 257/13 |
| 2015/0014724 A1* | 1/2015 | Choi et al. | 257/98 |
| 2015/0022999 A1* | 1/2015 | Yu et al. | 362/84 |
| 2015/0085466 A1* | 3/2015 | Edwards | 362/84 |

* cited by examiner

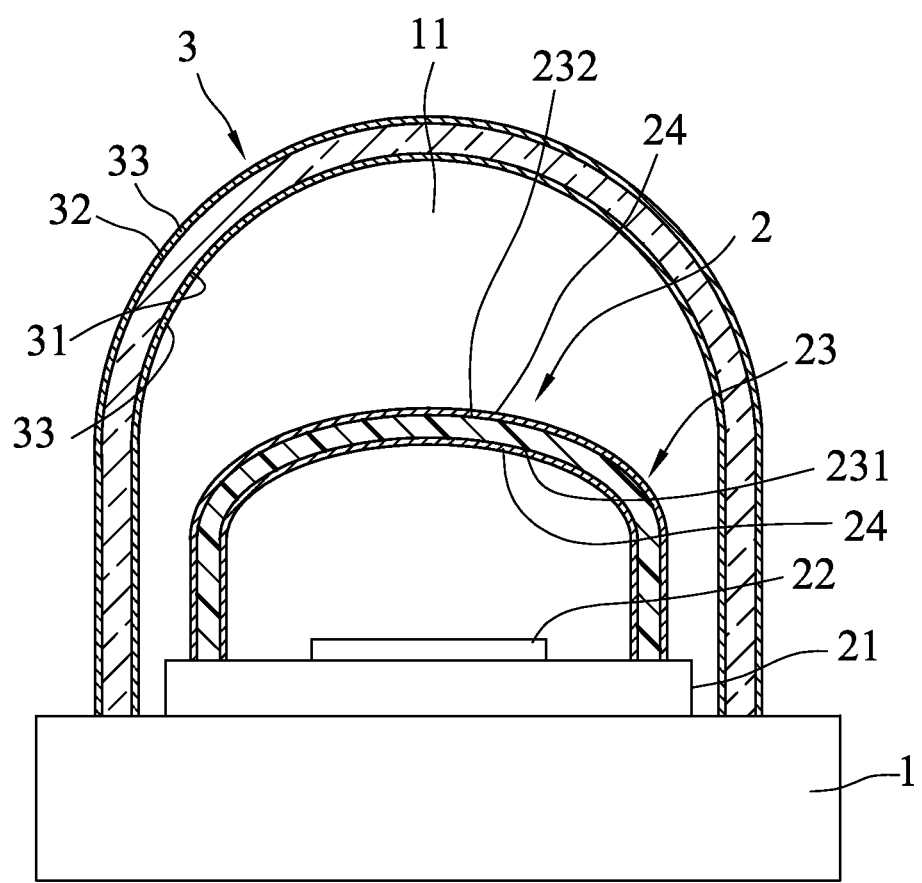

LIGHT-EMITTING DEVICE WITH GRAPHENE ENHANCED THERMAL PROPERTIES AND SECONDARY WAVELENGTH CONVERTING LIGHT SHADE

CROSS-REFERENCE TO RELATED APPLICATION

This application claims priority of Taiwanese Patent Application No. 102118970, filed on May 29, 2013.

BACKGROUND OF THE INVENTION

1. Field of the Invention

This invention relates to a light-emitting device, more particularly to a light-emitting device having high heat conductivity and high heat dissipation.

2. Description of the Related Art

A light-emitting device is a semiconductor component which may transform electrical energy into light energy, and has been utilized widely in the field of illumination because it has advantages of low power consumption, small volume, high transforming efficiency, long service life, and others. Specifically, a high power light-emitting diode having high luminance and high efficiency has been the focus of many researches.

However, the light-emitting device may produce a great amount of heat in the course of transforming electrical energy into light energy. If the heat accumulated in the light-emitting device is not effectively dissipated, the light-emitting device may deteriorate and the service life and the product stability of the light-emitting device may be reduced. Additionally, the heat produced from the high power light-emitting device designed for high luminance may be more significant. Therefore, in addition to enhancing the luminance of the highpower light-emitting device, the heat dissipation problem encountered in the high power light-emitting device is also required to be solved in the art.

In order to alleviate or even eliminate the heat problem produced in the light-emitting device, a heat conductive substrate is used to conduct and dissipate the heat produced from the light-emitting device. Alternatively, a mixture of an epoxy resin and metal powders (for example, silver powders) is used to package the light-emitting device. However, the heat resistance of the epoxy resin is inferior, and thus the epoxy resin is liable to deterioration or yellowing when being exposed to an elevated temperature environment. The light transmittance and the light output amount are decreased accordingly. Therefore, such a mixture is not suitable for the high power light-emitting device. Furthermore, although the heat conduction purpose may be achieved using the metal powders, the metal powders are opaque and may affect the light extraction efficiency of the light-emitting device. The aforesaid heat-dissipation methods may not be effectively used.

SUMMARY OF THE INVENTION

Therefore, an object of the present invention is to provide a light-emitting device having high heat conductivity and high heat dissipation.

According to this invention, there is provided a light-emitting device including a light-emitting component. The light-emitting component includes a circuit board, a light-emitting diode mounted on and electrically connected to the circuit board, a wavelength-converting shell covering the light-emitting diode, and a heat conductive layer formed on the wavelength-converting shell and including graphene.

BRIEF DESCRIPTION OF THE DRAWING

Other features and advantages of the present invention will become apparent in the following detailed description of the preferred embodiment of this invention, with reference to the accompanying drawing, in which:

FIG. 1 is a schematic sectional view illustrating a preferred embodiment of a light-emitting device according to this invention.

DETAILED DESCRIPTION OF THE PREFERRED EMBODIMENT

Referring to FIG. 1, the preferred embodiment of a light-emitting device according to the present invention includes a lamp holder 1, a light-emitting component 2, and a lamp shade 3.

The lamp shade 3 covers the light-emitting component 2, and is detachably engaged to the lamp holder 1 to define a receiving space 11 for receiving the light-emitting component 2.

The lamp holder 1 holds the light-emitting component 2 thereon, and is provided with a circuit unit (not shown) opposite to the receiving space 11 for being electrically connected to an external power source so as to provide electric power to the light-emitting component 2.

The light-emitting component 2 includes: a circuit board 21 mounted on and electrically connected to the lamp holder 1; at least one light-emitting diode 22 mounted on and electrically connected to the circuit board 21; a wavelength-converting shell 23 covering the light-emitting diode 22; and a first heat conductive layer formed on the wavelength-converting shell 23 and including graphene.

It should be noted that the number of the light-emitting diode 22 used in the light-emitting device of this invention can be adjusted according to the practical requirement. When a plurality of the light-emitting diodes 22 are used, the light-emitting diodes 22 may emit the same or different color light. In this preferred embodiment, a light-emitting diode emitting blue light is used as an illustrative example of the light-emitting diode 22.

The wavelength-converting shell 23 is made of a light-transmissive polymer material. Various fluorescent materials may be mixed with the light-transmissive polymer material. When the light emitted from the light-emitting diode 22 passes through the wavelength-converting shell 23, the fluorescent material may be excited to emit another color light, which blends with the light emitted from the light-emitting diode 22 to produce a blended light emitting outwardly. For example, a yellow fluorescent material may be mixed with the light-transmissive polymer material to make the wavelength-converting shell 23. When the blue light emitted from the light-emitting diode 22 passes through the wavelength-converting shell 23, the yellow light emitted from the yellow fluorescent material is blended with the blue light to produce a white light emitting outwardly.

In this preferred embodiment, the wavelength-converting shell 23 is made of polycarbonate blended with a yellow fluorescent material, and has an inner surface 231 facing toward the light-emitting diode 22 and an outer surface 232 opposite to the inner surface 231.

The first heat conductive layer 24 is formed on at least one of the inner surface 231 and the outer surface 232 of the wavelength-converting shell 23 partially or wholly. In this preferred embodiment, the first heat conductive layer 24 is formed on both of the inner surface 231 and the outer surface 232 of the wavelength-converting shell 23. The first heat conductive layer 24 includes graphene, and has a thermal conductivity of about 45 W/m·k and a light transmittance larger than 93%.

Specifically, the first heat conductive layer 24 is formed by applying a dispersion of graphene and a resin on the inner surface 231 and the outer surface 232 of the wavelength-converting shell 23 and curing the dispersion. The resin suitable for this invention is a thermocuring resin or a photocuring resin. Additionally, in order to enhancing the dispersibility of graphene in the resin, functionally modified graphene may be used or a dispersing agent may be added in the dispersion of graphene and the resin.

Furthermore, since the heat produced by the light-emitting device may gather in the voids formed among the graphene, the first heat conductive layer 24 may preferably include heat conductive nanowires and/or carbon nanotubes, which cooperate with graphene to forma network structure so as to enhance the heat dissipation effect of the first heat conductive layer 24.

Preferably, the heat conductive nanowire is made of gold, silver, copper, aluminum, platinum, aluminumnitride, titanium nitride, titanium carbide, and combinations thereof. More preferably, the heat conductive nanowire is made of silver.

The lamp shade 3 has an inner surface 31 facing toward the light-emitting component 2 and an outer surface 32 opposite to the inner surface 31 of the lamp shade 3. The light-emitting device further comprises a second heat conductive layer 33 which is formed on at least one of the inner surface 31 and the outer surface 32 of the lamp shade 3 partially or wholly and which includes graphene. In this preferred embodiment, the second heat conductive layer 33 is formed on both of the inner surface 31 and the outer surface 32 of the lamp shade 3. Similar to the first heat conductive layer 24, the second heat conductive layer 33 may preferably include the heat conductive nanowires and/or the carbon nanotubes.

The first heat conductive layer 24 and the second heat conductive layer 33 may extend to and contact with the circuit board 21 and the lamp holder 1, respectively. A heat-dissipating element (for example, a heat sink, not shown) is mounted on the circuit board 21 and the lamp holder 1 so as to further enhance the heat dissipation effect.

The lamp shade 3 is made of a light-transmissive material (for example, polycarbonate) and is formed with a predetermined pattern. When the light emitted from the light-emitting component 2 passes through the lamp shade 3, a light shape of the predetermined pattern may be produced.

In view of the aforesaid, in the light-emitting device of this invention, the first heat conductive layer 24 and the second heat conductive layer 33, both of which include graphene, are formed on the wavelength-converting shell 23 and the lamp shade 3, respectively. Therefore, the heat produced during the light emitting of the light-emitting component 2 may be effectively conducted and dissipated via the first heat conductive layer 24 and the second heat conductive layer 33. Since the epoxy resin is not used for packaging the light-emitting diode 22, the yellowing and cracking problems encountered in the prior art can be avoided. Furthermore, as compared to the metal powders used in the prior art, the graphene, the heat conductive nanowire, and the carbon nanotube used in the light-emitting device of this invention have the advantages of light transmittance, light weight, high heat conductivity, uniform heat conductivity, and others.

While the present invention has been described in connection with what is considered the most practical and preferred embodiment, it is understood that this invention is not limited to the disclosed embodiment but is intended to cover various arrangements included within the spirit and scope of the broadest interpretation and equivalent arrangements.

What is claimed is:

1. A light-emitting device, comprising:
   a light-emitting component including
      a circuit board;
      a light-emitting diode mounted on and electrically connected to said circuit board;
      a wavelength-converting shell covering said light-emitting diode; and
      a first heat conductive layer formed on said wavelength-converting shell and including graphene;
   a lamp holder for holding said light-emitting component; and
   a lamp shade for covering said light-emitting component and detachably engaged to said lamp holder,
   wherein said lamp shade has an inner surface facing toward said light-emitting component and an outer surface opposite to said inner surface of said lamp shade, said light-emitting device further comprising a second heat conductive layer which is formed on at least one of said inner surface and said outer surface of said lamp shade and which includes graphene.

2. The light-emitting device according to claim 1, wherein said wavelength-converting shell has an inner surface facing toward said light-emitting diode and an outer surface opposite to said inner surface, said first heat conductive layer being formed on at least one of said inner surface and said outer surface.

3. The light-emitting device according to claim 1, wherein said first heat conductive layer extends to said circuit board.

4. The light-emitting device according to claim 1, wherein said first heat conductive layer has a light transmittance larger than 93%.

5. The light-emitting device according to claim 1, wherein said first heat conductive layer further includes a heat conductive nanowire.

6. The light-emitting device according to claim 5, wherein said heat conductive nanowire is made of a material selected from the group consisting of gold, silver, copper, aluminum, platinum, aluminum nitride, titanium nitride, titanium carbide, and combinations thereof.

7. The light-emitting device according to claim 6, wherein said heat conductive nanowire is made of silver.

8. The light-emitting device according to claim 1, wherein said first heat conductive layer further includes a carbon nanotube.

9. The light-emitting device according to claim 1, wherein said second heat conductive layer further includes a heat conductive nanowire.

10. The light-emitting device according to claim 1, wherein said second heat conductive layer further includes a carbon nanotube.

11. The light-emitting device according to claim 1, wherein said second heat conductive layer extends to said lamp holder.

* * * * *